(12) United States Patent
Moon

(10) Patent No.: US 8,634,038 B2
(45) Date of Patent: Jan. 21, 2014

(54) ORGANIC LIGHT-EMITTING DISPLAY DEVICE AND ELECTRONIC EQUIPMENT INCLUDING THE SAME

(75) Inventor: Chan-Kyoung Moon, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 293 days.

(21) Appl. No.: 12/965,732

(22) Filed: Dec. 10, 2010

(65) Prior Publication Data

US 2011/0242743 A1  Oct. 6, 2011

(30) Foreign Application Priority Data

Apr. 6, 2010  (KR) .................. 10-2010-0031557

(51) Int. Cl.
*G02F 1/1333* (2006.01)

(52) U.S. Cl.
USPC .......................................... 349/58

(58) Field of Classification Search
USPC .......................................... 349/58
See application file for complete search history.

(56) References Cited

U.S. PATENT DOCUMENTS

| | | |
|---|---|---|
| 2007/0262705 A1 | 11/2007 | Fukuda et al. |
| 2008/0116792 A1 | 5/2008 | Chung et al. |
| 2008/0120946 A1 | 5/2008 | Bayne et al. |
| 2009/0026945 A1 | 1/2009 | Boroson et al. |
| 2009/0165532 A1* | 7/2009 | Yee et al. ............... 73/12.09 |
| 2009/0195973 A1* | 8/2009 | Yee et al. ............... 361/679.21 |
| 2009/0261718 A1* | 10/2009 | Ha et al. ............... 313/504 |
| 2010/0142172 A1* | 6/2010 | Moon et al. ............... 361/809 |

FOREIGN PATENT DOCUMENTS

| | | |
|---|---|---|
| KR | 1020040024952 A | 3/2004 |
| KR | 1020070044576 A | 4/2007 |
| KR | 1020080041976 A | 5/2008 |
| KR | 1020090006708 A | 1/2009 |
| KR | 1020090093058 | 9/2009 |
| KR | 1020090093058 A | 9/2009 |

OTHER PUBLICATIONS

Korean Notice of Allowance issued by Korean Patent Office on Feb. 17, 2012 in connection with Korean Patent Application No. 10-2010-0031557 and Request for Entry attached herewith.
Korean Office action issued on Jul. 29, 2011 by KIPO (corresponding to Korean Application No. 10-2010-0031557), together with "Request for Entry".

* cited by examiner

*Primary Examiner* — Phu Vu
(74) *Attorney, Agent, or Firm* — Robert E. Bushnell, Esq.

(57) ABSTRACT

An organic light-emitting display device having improved impact resistance by including a buffer member for reducing an external impact, and electronic equipment including the organic light-emitting display device. The organic light-emitting display device includes a frame, a panel assembly and a compression buffer tape arranged between the frame and the panel assembly, wherein the panel assembly includes a first substrate, a display unit arranged on a surface of the first substrate, a second substrate arranged to face the first substrate and a sealant arranged along edges of the first substrate and the second substrate to attach the second substrate to the first substrate.

15 Claims, 5 Drawing Sheets

ORGANIC LIGHT-EMITTING DISPLAY DEVICE AND ELECTRONIC EQUIPMENT INCLUDING THE SAME

CLAIM OF PRIORITY

This application makes reference to, incorporates the same herein, and claims all benefits accruing under 35 U.S.C. §119 from an application for ORGANIC LIGHT-EMITTING DISPLAY DEVICE AND ELECTRONIC EQUIPMENT INCLUDING THE SAME earlier filed in the Korean Intellectual Property Office on 6 Apr. 2010 and there duly assigned Serial No. 10-2010-0031557.

BACKGROUND OF THE INVENTION

1. Field of the Invention

The present invention relates to an organic light-emitting display device having improved impact resistance by including a compressible buffer member to reduce external impact and electronic equipment including the same.

2. Description of the Related Art

In general, flat panel display devices may be classified into light-emitting flat panel display devices and light-receiving flat panel display devices. Examples of light-emitting flat panel display devices may include flat cathode ray tubes, plasma display panels, electroluminescent display devices, and light-emitting diodes. Examples of light-receiving flat panel display devices may include liquid crystal displays. Among them, electroluminescent display devices have been highlighted as the next generation display devices because of their wide viewing angle, high contrast, and fast response time. Electroluminescent display devices are classified into inorganic electroluminescent display devices and organic electroluminescent display devices according to materials used to form light-emitting layers.

Among them, organic electroluminescent display devices, which are self-emitting display devices for emitting light by electrically exciting fluorescent organic compounds, have been highlighted as the next generation of display devices, and can overcome shortcomings of liquid crystal displays by having characteristics such as low driving voltage, thin and small design, wide viewing angle, and fast response time.

Organic electroluminescent display devices include a light-emitting layer having an organic material arranged between an anode and a cathode. In the organic electroluminescent display devices, when an anode voltage and a cathode voltage are respectively applied to the anode and the cathode, holes migrate from the anode to the light-emitting layer through a hole transport layer and electrons migrate from the cathode to the light-emitting layer through an electron transport layer to recombine with each other and generate excitons. The excitons change from an excited state to a ground state to enable fluorescent molecules of the light-emitting layer to emit light, thereby forming an image. Full-color organic electroluminescent display devices create a full-color image by including pixels for emitting light of red (R), green (G), and blue (B) colors.

In general, organic light-emitting display devices include a panel assembly in which an organic electroluminescent display device is disposed, a housing in which the panel assembly is received, and a printed circuit board electrically connected to the panel assembly through a flexible circuit board.

Such organic light-emitting display devices are vulnerable to impact caused by dropping because two substrates constituting the panel assembly are thin, and unlike liquid crystal display devices including a panel assembly in which liquid crystal is filled within, there is an empty space in the panel assembly of an organic light-emitting display.

Accordingly, if a user carelessly drops during handling electronic equipment in which an organic light-emitting display device is mounted, since a large twisting load or bending load is suddenly applied to the panel assembly, the panel assembly may be easily damaged.

SUMMARY OF THE INVENTION

The present invention provides an organic light-emitting display device having improved impact resistance by including a compressible buffer member to reduce an external impact.

According to an aspect of the present invention, there is provided an organic light-emitting display device including a frame, a panel assembly and a compression buffer tape arranged between the frame and the panel assembly, wherein the panel assembly includes a first substrate, a display unit arranged on a surface of the first substrate, a second substrate arranged to face the first substrate and a sealant arranged along edges of the first substrate and the second substrate to attach the second substrate to the first substrate.

The compression buffer tape may be compressed by the panel assembly and may have a thickness greater than a distance between the first substrate of the panel assembly and the frame. A compressive force applied to the compression buffer tape may vary according to location. A compressive force applied to a portion of the compression buffer tape arranged at a location corresponding to the display unit at a center of the first substrate may be greater than a compressive force applied to a portion of the compression buffer tape arranged at a location corresponding to an edge of the first substrate. The compression buffer tape may minimize a maximum separation distance between the first substrate and the second substrate upon impact. The compression buffer tape may have a thickness that varies with location. A thickness of the compression buffer tape at a central portion of the compression buffer tape may be greater than a thickness at an edge portion of the compression buffer tape.

According to another aspect of the present invention, there is provided an electronic equipment that includes the organic light-emitting display device as recited above, a housing to receive the organic light-emitting display device and a transparent window fixed to a front side of the housing. The electronic equipment may also include an adhesive member having a buffer function arranged between the housing and the transparent window. One end portion of the housing contacting the transparent window may be bent to cover an edge portion of the transparent window. The edge portion of the transparent window contacting the one end portion of the housing may be stepped.

BRIEF DESCRIPTION OF THE DRAWINGS

A more complete appreciation of the invention and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

The present invention will now be described more fully with reference to the accompanying drawings, in which exemplary embodiments of the invention are shown, so as to be easily made and used by one of ordinary skill in the art. The present invention may be embodied in many different forms and should not be construed as being limited to the embodiments set forth herein.

Figure 1A:
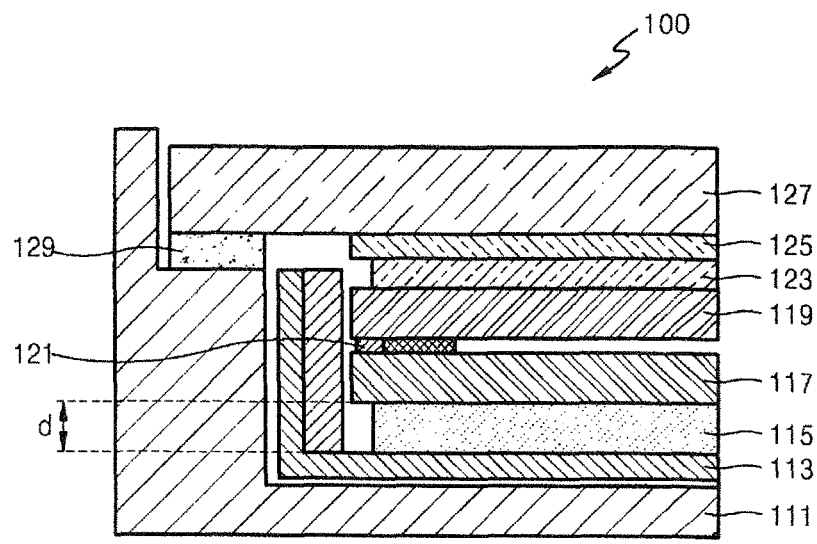
FIG. 1A is a cross-sectional view of an organic light-emitting display device according to an embodiment of the present invention.

Turning now to FIG. 1A, FIG. 1A is a cross-sectional view of an organic light-emitting display device 100 according to an embodiment of the present invention. Referring to FIG. 1A, the organic light-emitting display device 100 includes a housing 111, a frame 113, a compression buffer tape 115, a first substrate 117, a second substrate 119, a sealant 121, a polarization plate 123, a resin 125, a transparent window 127, and an adhesive member 129.

In detail, the housing 111 is an outer cover of the organic light-emitting display device 100. The frame 113, in which a panel assembly is received, is disposed within the housing 111.

The panel assembly is received within the frame 113, and includes the first substrate 117 and the second substrate 119 facing each other, and the sealant 121 for attaching the second substrate 119 to the first substrate 117. In detail, a display unit (not shown), including an organic light-emitting element, is disposed on the first substrate 117. The first substrate 117 may be made out of a transparent glass material that includes $SiO_2$ as a main component, however the first substrate 117 is not limited thereto and may instead be made out of a transparent plastic material. The second substrate 119 is attached to a top surface of the first substrate 117 that includes the display unit. The second substrate 119 may be made out of a glass material, but the present embodiment is not limited thereto as the second substrate 119 may instead be made out of any of various plastic materials, such as acryl, or may instead be made out of a metal material. The first substrate 117 and the second substrate 119 are attached to each other by using the sealant 121. The sealant 121 may be a commonly used material such as sealing glass frit.

The polarization plate 123, the resin 125, and the transparent window 127 are sequentially disposed on the second substrate 119, and the adhesive member 129 is formed along an edge of the transparent window 127 to adhere the transparent window 127 to the housing 111. The adhesive member 129 may be a gasket cushion adhesive that may also serve as a buffer member.

The compression buffer tape 115 is disposed between the frame 113 and the first substrate 117 to adhere the first substrate 117 to the frame 113 and to also reduce any impact applied to the panel assembly that includes the first substrate 117, the second substrate 119, and the sealant 121, which will be explained later in detail as follows.

Figure 2A:
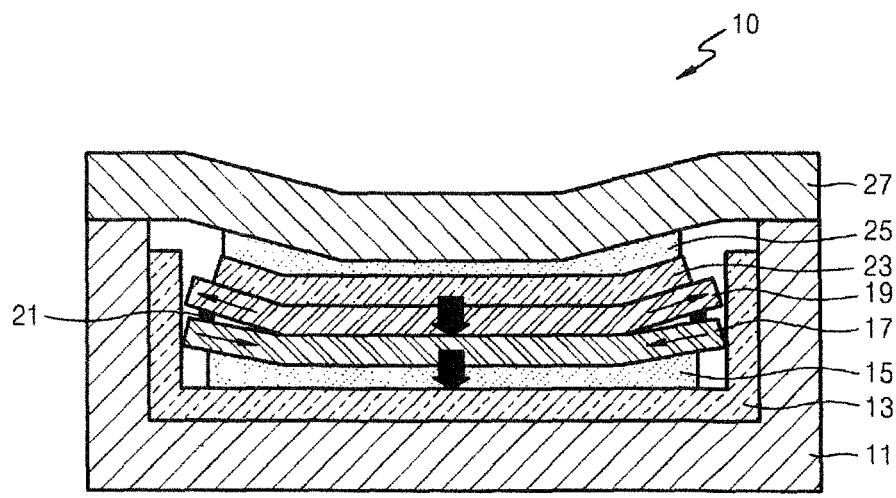
FIGS. 2A through 2D are cross-sectional views illustrating a state where a sealant is damaged when an impact caused by dropping is applied to an organic light-emitting display device.
Figure 2B:
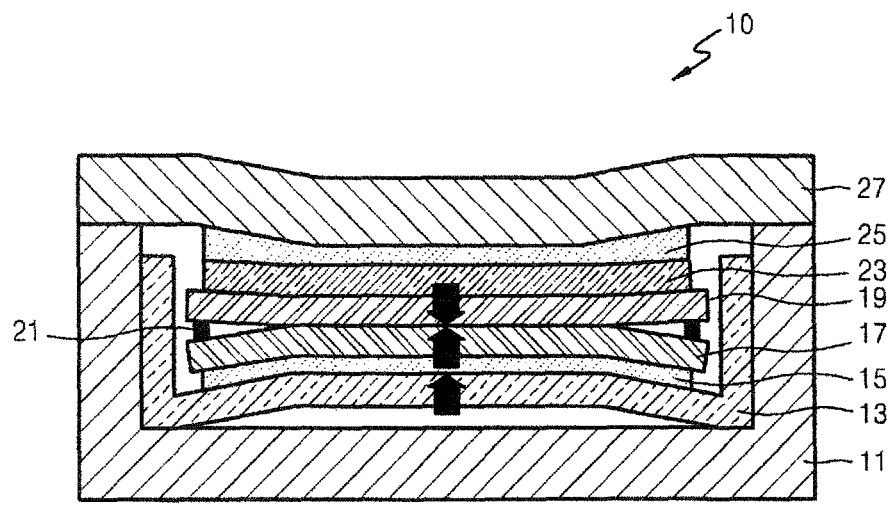
Figure 2C:
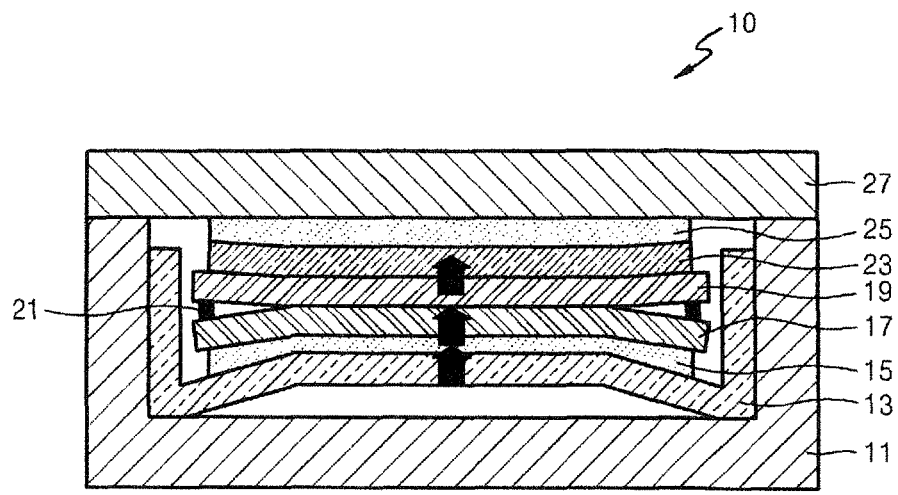
Figure 2D:
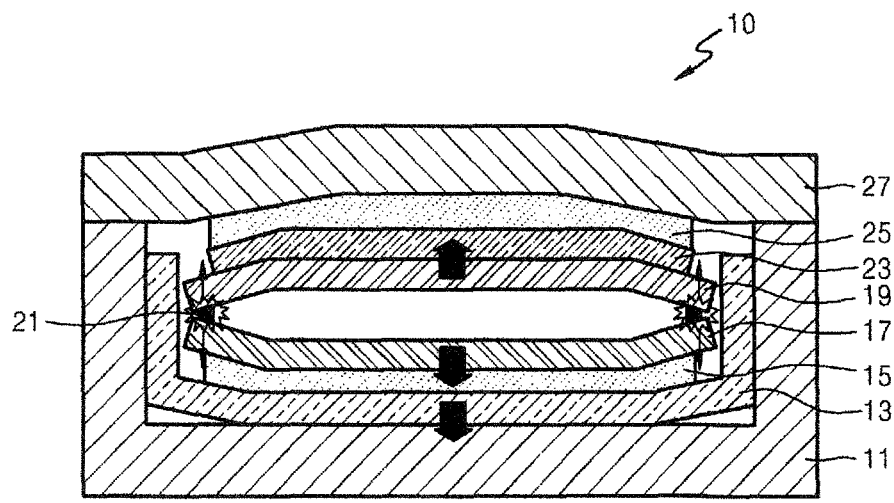

Turning now to FIGS. 2A to 2D, FIGS. 2A through 2D are cross-sectional views illustrating a state where a sealant 21 is damaged upon impact caused by dropping an organic light-emitting display device 10. As illustrated in FIGS. 2A through 2D, the electrical equipment 10 includes a housing 11, a transparent window 27 attached to the housing 11, a frame 13 arranged within a housing 11, non-compression buffer tape 15 arranged on frame 13, first substrate 17 sealed by sealant 21 to second substrate 19 and arranged on tape 15 and having an interval between first substrate 17 and second substrate 19, polarization plate 23 arranged on second substrate 19 and resin 25 arranged between polarization plate 23 and transparent window 27. As shown in FIG. 2A, if an impact caused by dropping is applied to the organic light-emitting display device 10, the first substrate 17 and the second substrate 19 move toward the ground. Then, when the first substrate 17 moves to the maximum position, as shown in FIG. 2B, due to the repulsive force of the first substrate 17, the first substrate 17 moves away from the ground, and as a result, as shown in FIG. 2C, the second substrate 19 also moves away from the ground. Then, when the first substrate 17 reaches a threshold point, the second substrate 19 continuously rises whereas the first substrate 17 begins to fall, and thus the first substrate 17 and the second substrate 19 move in opposite directions as in FIG. 2D. As a distance between the first substrate 17 and the second substrate 19 increases, a greater tensile stress is applied to the sealant 21. Since the sealant 21 made out of a glass material is vulnerable to tensile stress, when the tensile stress applied to the sealant 21 increases upon the distance between the first substrate 17 and the second substrate 19 increasing at the time of impact, the sealant 21 is damaged, thereby damaging the first substrate 17 and the second substrate 19 due to the damage to the sealant 21.

Furthermore, as a window-integrated structure, which removes a gap between a window and a panel assembly in order to improve outdoor visibility and easily achieve a lightweight and thin design, has recently been preferred, the distance between the first substrate 17 and the second substrate 19 has further increased.

In order to solve the problem, the organic light-emitting display device 100 of FIG. 1A includes the compression buffer tape 115 that is disposed between the frame 113 and the first substrate 117 to adhere the frame 113 to the first substrate 117 and reduce an impact applied to the panel assembly, that is, the first substrate 117, the second substrate 119, and the sealant 121.

Figure 1B:
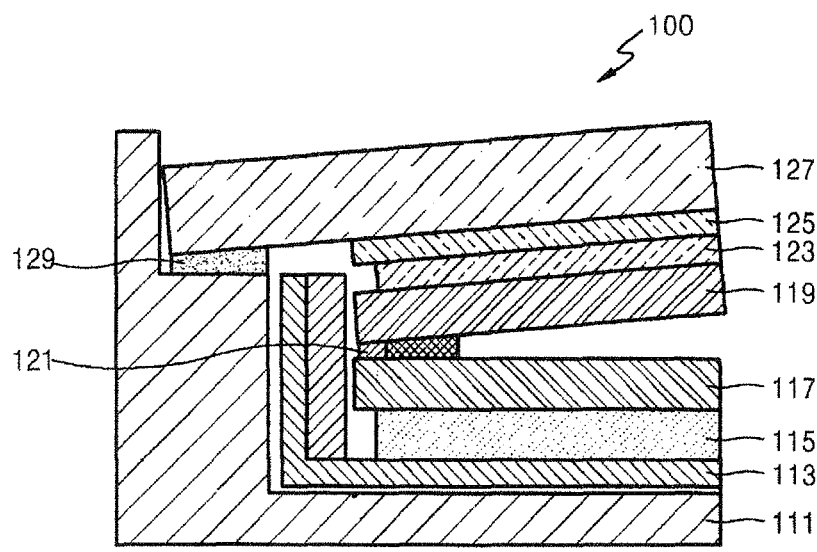
FIGS. 1B and 1C are cross-sectional views of the organic light emitting display device of FIG. 1A upon impact caused by dropping the organic light-emitting display device of FIG. 1A.
Figure 1C:
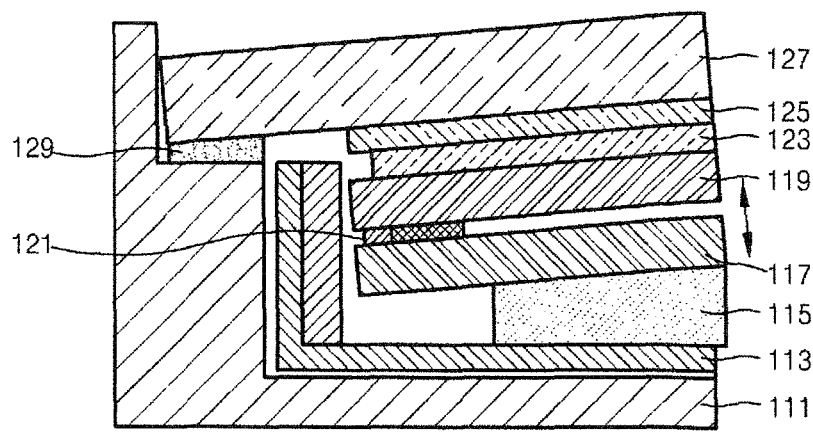

As described above, if an impact caused by dropping is applied to the organic light-emitting display device 100, since the first substrate 117 moves downward while the second substrate 119 moves upward so that a distance between the first substrate 117 and the second substrate 119 increases, the highest impact is applied to the sealant 121 is when the distance between the first substrate 117 and the second substrate 119 is the greatest. Accordingly, it is important to minimize a maximum separation distance between the first substrate 117 and the second substrate 119, and to this end, the compression buffer tape 115 is disposed between the first substrate 117 and the frame 113. Once the compression buffer tape 115 is disposed between the first substrate 117 and the frame 113, the first substrate 117 and the second substrate 119 move in the same direction upon impact due to the restoring force of the compression buffer tape 115, and thus the maximum separation distance between the first substrate 117 and the second substrate 119 is minimized. That is, as shown in FIG. 1B, if an impact caused by dropping is applied to the organic light-emitting display device 100 and the second substrate 119 moves upward, as shown in FIG. 1C, the first substrate 117 also moves upward along with the second substrate 119 due to the restoring force of the compression buffer tape 115. As shown in FIG. 1C, the right portion of compression buffer tape 115 is stretched and a gap between the first substrate 117 and second substrate 119 in FIG. 1C is narrower than in FIG. 1B. Accordingly, since the maximum separation distance between the first substrate 117 and the second substrate 119 is minimized, a tensile stress and impact energy applied to the sealant 121 may be reduced, thereby preventing damage to the first substrate 117 and the second substrate 119 due to damage to the sealant 121.

The compression buffer tape 115 may be disposed on frame 113 and have a thickness greater than a distance "d" between the first substrate 117 and the frame 113. The panel assembly that includes the first substrate 117 is then mounted on the compression buffer tape 115 so that the first substrate 117 presses down on the compression buffer tape 115 to cause the compression buffer tape 115 to have a desired thickness corresponding to the thickness "d".

The organic light-emitting display device 100 of FIG. 1A may be formed so that a compressive force applied to the compression buffer tape 115 varies with respect to location. In detail, the compression buffer tape 115 may be formed so that a compressive force applied to a central portion of the compressive buffer tape 115 at a location corresponding to the display unit is greater than a compressive force applied to the compression buffer tape 115 at an edge of the first substrate 117. This may be achieved by varying the thickness of the compression buffer tape 115 according to location so that the thickness of the central portion of the compression buffer tape 115 is greater than the thickness of an edge portion of the compression buffer tape 115.

If the compression buffer tape 115 having the same thickness is used, since the compression buffer tape 115 pushes upward an entire surface of the panel assembly at the time of impact, the first substrate 117 is entirely pushed upward, thereby making the amount of displacement of the first substrate 117 small. However, if a buffer tape having no compressive force is used at a side portion and a buffer tape having a high compressive force is used at a central portion, since the center of the first substrate 117 is pushed more strongly, strength is improved. Also, if the compression buffer tape 115 having the same thickness is used, since the entire surface of the panel assembly is pushed, a force for pushing the panel assembly is increased, thereby increasing the possibility of separating the panel assembly from the housing 111 at the time of dropping. However, if a buffer tape having little compressive force is used at a side portion and a buffer tape having a high compressive force is used only at a central portion, a force for pushing the panel assembly is less than that in a case of pushing the entire surface of the panel assembly, thereby reducing the possibility of separating the panel assembly from the housing 111 at the time of dropping.

Figure 3:
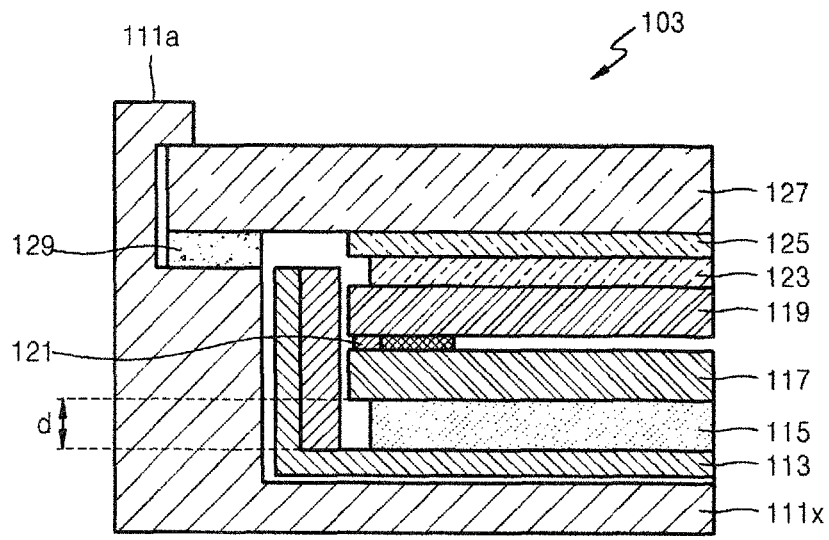
FIG. 3 is a cross-sectional view of the organic light-emitting display device according to another embodiment of the present invention.

Turning now to FIG. 3, FIG. 3 is a cross-sectional view of the organic light-emitting display device 103 according to another embodiment of the present invention. Referring to FIG. 3, the organic light-emitting display device 103 includes housing 111x, the frame 113, the compression buffer tape 115, the first substrate 117, the second substrate 119, the sealant 121, the polarization plate 123, the resin 125, the transparent window 127, and the adhesive member 129. Since a difference between the organic light-emitting display device 103 of FIG. 3 and the organic light-emitting display device 100 of FIG. 1A is a structural relationship between the housing 111x and the transparent window 127, the following explanation will be made by focusing on the difference.

As described above, when the compression buffer tape 115 is formed between the frame 113 and the first substrate 117, an impact applied to the first substrate 117, the second substrate 119, and the sealant 121 may be reduced whereas an impact applied to the adhesive member 129 for adhering the transparent window 127 to the housing 111 may be increased. Accordingly, there is a possibility of separating the transparent window 127 from the housing 111 at the time of dropping.

To solve the problem, the organic light-emitting display device 103 of FIG. 3 is characterized in that one end portion 111a of the housing 111x contacting the transparent window 127 is bent to cover an edge of the transparent window 127, thereby preventing the transparent window 127 from being easily separated from the housing 111x. Accordingly, the impact resistance of the organic light-emitting display device 103 may be further improved.

Figure 4:
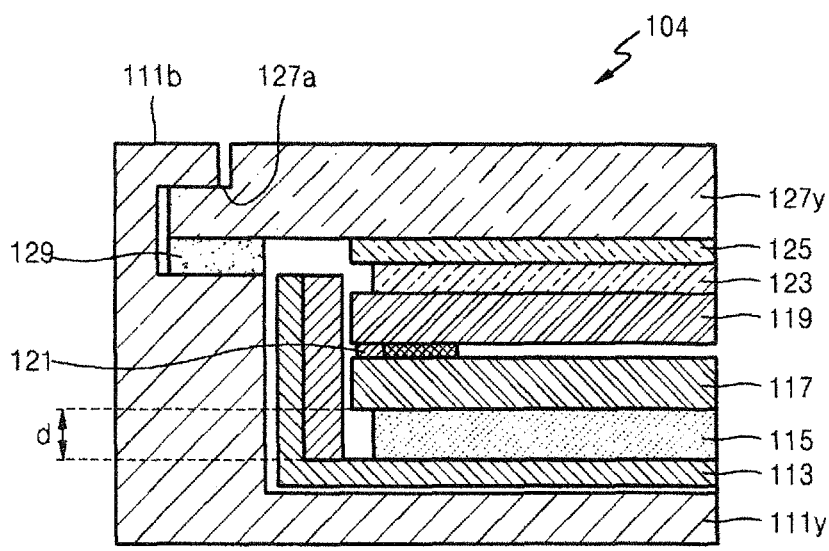
FIG. 4 is a cross-sectional view of the organic light-emitting display device according to yet another embodiment of the present invention.

Turning now to FIG. 4, FIG. 4 is a cross-sectional view of the organic light-emitting display device 104 according to another embodiment of the present invention. Referring to FIG. 4, the organic light-emitting display device 104 includes the housing 111y, the frame 113, the compression buffer tape 115, the first substrate 117, the second substrate 119, the sealant 122, the polarization plate 123, the resin 125, the transparent window 127y, and the adhesive member 129. The organic light-emitting display device 104 of FIG. 4 is different from the organic light-emitting display device 103 of FIG. 3 in that an edge portion 127a of the transparent window 127y is stepped and the bent one end portion 111b of the housing 111y is engaged with the edge portion 127a. Accordingly, the impact resistance of the organic light-emitting display device 104 may be further improved.

As described above, the organic light-emitting display device and the electronic equipment including the same according to the present invention may improve impact resistance.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An organic light-emitting display device, comprising:
   a panel assembly, wherein the panel assembly includes a first substrate, a display unit arranged on a surface of the first substrate, a second substrate arranged to face the first substrate and a sealant arranged along edges of the first substrate and the second substrate to attach the second substrate to the first substrate, wherein images produced by the display unit are viewed through the second substrate, and an external major surface of the first substrate corresponds to a rear of the panel assembly;
   a frame covering an entirety of the external major surface of the first substrate of the panel assembly that corresponds to the rear of the panel assembly; and
   a compression buffer tape arranged between the frame and the external major surface of the first substrate of the panel assembly that corresponds to the rear of the panel assembly, the compression buffer tape decreasing in thickness with distance from a center of the first substrate.

2. The organic light-emitting display device of claim 1, wherein the compression buffer tape is compressed by the panel assembly and has a thickness greater than a distance between the external major surface of the first substrate of the panel assembly and the frame.

3. The organic light-emitting display device of claim 1, wherein a compressive force applied to the compression buffer tape varies according to location due to a corresponding variation in thickness of the compression buffer tape with location.

4. The organic light-emitting display device of claim 3, wherein a compressive force applied to a portion of the compression buffer tape arranged at a location corresponding to the display unit at a center of the first substrate is greater than a compressive force applied to portions of the compression buffer tape arranged at locations corresponding to edges of the first substrate by having a thickness of the compressive buffer tape greater at the location corresponding to the center of the first substrate than at the locations corresponding to the edges of the first substrate.

5. The organic light-emitting display device of claim 1, wherein the compression buffer tape minimizes a maximum separation distance between the first substrate and the second substrate upon impact.

6. The organic light-emitting display device of claim 1, wherein the compression buffer tape has a thickness that varies with location that corresponds to a compressive force applied to the compression buffer tape by the panel assembly.

7. An organic light-emitting display device, comprising:
a frame;
a panel assembly; and
a compression buffer tape arranged between the frame and the panel assembly, wherein the panel assembly includes a first substrate, a display unit arranged on a surface of the first substrate, a second substrate arranged to face the first substrate and a sealant arranged along edges of the first substrate and the second substrate to attach the second substrate to the first substrate, wherein the compression buffer tape has a thickness that varies with location, wherein a thickness of the compression buffer tape at a central portion of the compression buffer tape is greater than a thickness at an edge portion of the compression buffer tape.

8. An electronic equipment, comprising:
the organic light-emitting display device of claim 1;
a housing to receive the organic light-emitting display device; and
a transparent window fixed to a front side of the housing and covering a front side of the panel assembly, wherein images produced by the display unit are viewed through the transparent window.

9. An electronic equipment, comprising:
an organic light-emitting display device, comprising:
a frame;
a panel assembly; and
a compression buffer tape arranged between the frame and the panel assembly, wherein the panel assembly includes a first substrate, a display unit arranged on a surface of the first substrate, a second substrate arranged to face the first substrate and a sealant arranged along edges of the first substrate and the second substrate to attach the second substrate to the first substrate;
a housing to receive the organic light-emitting display device;
a transparent window fixed to a front side of the housing; and
an adhesive member having a buffer function arranged between the housing and the transparent window.

10. The electronic equipment of claim 8, wherein one end portion of the housing contacting the transparent window is bent to cover an edge portion and an adjoining portion of a front side of the transparent window.

11. The electronic equipment of claim 10, wherein the edge portion of the transparent window contacting the one end portion of the housing is stepped.

12. The electronic equipment of claim 8, further comprising an adhesive member having a buffer function arranged between the housing and the transparent window.

13. The organic light-emitting display device of claim 6, wherein a thickness of the compression buffer tape at a central portion of the compression buffer tape is greater than a thickness at an edge portion of the compression buffer tape.

14. The organic light-emitting display device of claim 1, wherein the compression buffer tape being present near side portions and a central portion of the first substrate of the panel assembly, the compression buffer tape being thinner near the side portions than at the central portion of the first substrate.

15. The organic light-emitting display device of claim 1, the compression buffer tape increasing in thickness and in compressive force with distance from a nearest peripheral edge of the first substrate.

* * * * *